US011271109B2

United States Patent
Chang et al.

(10) Patent No.: US 11,271,109 B2
(45) Date of Patent: Mar. 8, 2022

(54) SILICON METAL-OXIDE-SEMICONDUCTOR FIELD EFFECT TRANSISTOR (SI MOSFET) WITH A WIDE-BANDGAP III-V COMPOUND SEMICONDUCTOR GROUP DRAIN AND METHOD FOR FABRICATING THE SAME

(71) Applicant: NATIONAL CHIAO TUNG UNIVERSITY, Hsinchu (TW)

(72) Inventors: Edward Yi Chang, Hsinchu County (TW); Mau-Chung Frank Chang, Taipei (TW); Chieh-Hsi Chuang, Hsinchu (TW); Jessie Lin, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 17/007,967

(22) Filed: Aug. 31, 2020

(65) Prior Publication Data
US 2021/0159338 A1    May 27, 2021

Related U.S. Application Data

(60) Provisional application No. 62/960,271, filed on Jan. 13, 2020.

(30) Foreign Application Priority Data

Nov. 26, 2019   (TW) .................... 108142879

(51) Int. Cl.
*H01L 29/78*      (2006.01)
*H01L 29/06*      (2006.01)
(Continued)

(52) U.S. Cl.
CPC .......... *H01L 29/7833* (2013.01); *H01L 29/04* (2013.01); *H01L 29/0653* (2013.01);
(Continued)

(58) Field of Classification Search
CPC ........... H01L 21/02381; H01L 21/0243; H01L 21/02433; H01L 21/02516;
(Continued)

(56) References Cited

U.S. PATENT DOCUMENTS 6,218,711 B1    4/2001  Yu
8,313,967 B1 *  11/2012 Lee ................... H01L 29/045
                                                       438/44
(Continued)

FOREIGN PATENT DOCUMENTS

JP    2010-0527153 A    8/2010
JP    2010-527153 A     8/2010
(Continued)

OTHER PUBLICATIONS

Koo, et al., "Selective Epitaxial Growth of Stepwise SiGe:B at the Recessed Sources and Drains: A Growth Kinetics and Strain Distribution Study", AIP Advances 6(9):095114, doi: 10.1063/1.4963296.
(Continued)

*Primary Examiner* — David C Spalla
(74) *Attorney, Agent, or Firm* — Rosenberg, Klein & Lee

(57) ABSTRACT

A silicon metal-oxide-semiconductor field effect transistor with a wide-bandgap III-V compound semiconductor drain and a method for fabricating the same are disclosed. The method fabricates a hundred nanometer-scale hole in a (100) silicon substrate to expose the (111) facet of the silicon substrate, which favors to use selective area growth to form lattice matched III-V materials with high quality.

18 Claims, 8 Drawing Sheets

(51) Int. Cl.
- *H01L 29/04* (2006.01)
- *H01L 29/08* (2006.01)
- *H01L 29/66* (2006.01)
- *H01L 29/267* (2006.01)
- *H01L 21/02* (2006.01)
- *H01L 21/306* (2006.01)
- *H01L 29/16* (2006.01)
- *H01L 29/20* (2006.01)

(52) U.S. Cl.
CPC ...... *H01L 29/0676* (2013.01); *H01L 29/0847* (2013.01); *H01L 29/267* (2013.01); *H01L 29/66492* (2013.01); *H01L 29/66522* (2013.01); *H01L 29/66636* (2013.01); H01L 21/0243 (2013.01); H01L 21/0254 (2013.01); H01L 21/0262 (2013.01); H01L 21/02381 (2013.01); H01L 21/02433 (2013.01); H01L 21/02598 (2013.01); H01L 21/02639 (2013.01); H01L 21/30604 (2013.01); H01L 29/16 (2013.01); H01L 29/2003 (2013.01); H01L 29/66545 (2013.01)

(58) Field of Classification Search
CPC ......... H01L 21/02598; H01L 21/02603; H01L 21/02609; H01L 21/0262; H01L 21/02639; H01L 21/30604; H01L 21/823418; H01L 21/823814; H01L 27/1222; H01L 29/04; H01L 29/0653; H01L 29/0665; H01L 29/0669; H01L 29/0673; H01L 29/0843; H01L 29/0847; H01L 29/16; H01L 29/2003; H01L 29/267; H01L 29/66439; H01L 29/66492; H01L 29/66545; H01L 29/66636; H01L 29/775; H01L 29/7833

See application file for complete search history.

(56) References Cited

U.S. PATENT DOCUMENTS

| | | | |
|---|---|---|---|
| 2006/0138398 A1* | 6/2006 | Shimamune | H01L 29/66628 257/19 |
| 2010/0123174 A1 | 5/2010 | Mao et al. | |
| 2012/0309171 A1* | 12/2012 | Lu | H01L 29/7848 438/478 |
| 2016/0351744 A1 | 12/2016 | Sekiguchi et al. | |
| 2017/0207307 A1* | 7/2017 | Dasgupta | H01L 21/76229 |
| 2017/0236936 A1* | 8/2017 | Then | H01L 21/02433 257/76 |
| 2019/0019865 A1 | 1/2019 | Tang | |

FOREIGN PATENT DOCUMENTS

| | | |
|---|---|---|
| JP | 2011-165859 A | 8/2011 |
| JP | 2013004594 A | 1/2013 |
| KR | 10-2009-0088670 A | 8/2009 |
| TW | 201801151 A | 1/2018 |
| TW | 201828327 A | 8/2018 |

OTHER PUBLICATIONS

Bauer, et al., 2010, "Invited Selective Epitaxial Growth (SEG) of Highly Doped Si:P on Source/Drain Areas of NMOS Devices Using Si" doi: 10.1149/1.3487593.

JPO Notification of Reason of Refusal dated Oct. 12, 2021 for corresponding JP Application No. 2020-188266.

* cited by examiner

SILICON METAL-OXIDE-SEMICONDUCTOR FIELD EFFECT TRANSISTOR (SI MOSFET) WITH A WIDE-BANDGAP III-V COMPOUND SEMICONDUCTOR GROUP DRAIN AND METHOD FOR FABRICATING THE SAME

This application claims priority for Taiwan patent application no. 108142879 filed on 26 Nov. 2019, the content of which is incorporated by reference in its entirely.

BACKGROUND OF THE INVENTION

Field of the Invention

The present invention relates to a heterogeneously integrated silicon metal-oxide-semiconductor field effect transistor, particularly to a silicon metal-oxide-semiconductor field effect transistor with a wide-bandgap III-V compound semiconductor (for instance, 3.4 eV for GaN versus 1.1 eV for Si) drain and a method for fabricating the same.

Description of the Related Art

The III-V compound semiconductors, such as gallium nitride (GaN) material, have many unique physical characteristics, such as wide energy gap (3.4 eV) between the material's valence and conduction bands, low electron impact ionization coefficient ($<1\times10^{-6}$ versus that of Silicon) leading to high breakdown voltage, high electron drift velocity, etc. Thus, the wide-bandgap III-V compound semiconductors are promising for building high power handling, high breakdown voltage, and high-speed electronic components. In recent years, research teams from various countries have formed thin (nano-scaled) gallium nitride epitaxial layers on (100) silicon substrates by using Metal Organic Chemical Vapor Deposition (MOCVD) and super-lattice buffered layer structures, thereby heterogeneously growing III-V compound semiconductors on various directional silicon substrates. Nevertheless, III-V compound semiconductors are mostly used in LED-related photonic applications.

Guided by Moore's Law, Metal Oxide Semiconductor Field-effect Transistors (MOSFETs) gate dimensions have scaled down to below 10 nm and enabled unprecedented performance in digital switching and logic functions. However, scaling down also constraints device's dynamic operation range and power handling capabilities. For example, a MOSFET that is deeply scaled down has a very low drain breakdown voltage (<2V), which limits its signal voltage swing to less than 1V. Therefore, cellular base stations and Smartphone communications have to use external radio-frequency (RF) or microwave power amplifiers composed of III-V Heterojunction Bipolar Transistors (HBTs). However, when telecommunications (5G/6G) must use higher microwave and/or millimeter-wave frequencies for wider bandwidths and higher data rates, this technology will no longer be cost/performance-effective. In the millimeter-wave radio/radar band, the signal loss of the external power amplifier/switch via board/package will be too high to meet the stringent system requirements in both linearity and efficiency, especially the talk time requirements of smartphones due to low power-added-efficiency. Besides, the scaled CMOS device with low drain breakdown voltage has limited dynamic operation range cannot support the data conversion resolution requirements for future high-frequency digital radios, radars, imagers, and other detectors/sensors.

In the past, silicon MOSFETs may utilize silicon germanium (SiGe) as the source/drain material. For example, the U.S. Pat. No. 6,218,711 selectively grew SiGe materials protruding up from the source/drain, and the positions of the two electrodes were raised to improve the short channel effect. Nevertheless, the SiGe material has an even lower breakdown voltage than that of silicon. Thus, the SiGe drain material will not be able to meet circuit requirements for high dynamic range at all.

SUMMARY OF THE INVENTION

To overcome the abovementioned problems, the present invention provides a silicon metal-oxide-semiconductor field effect transistor with a wide-bandgap III-V compound material drain and a method for fabricating the same, which selectively grows III-V compound materials only in the opened MOSFET drain area with etched and exposed Si (111) facet on a Si (100) substrate for standard CMOS fabrication, thereby fabricating a III-V drain structure with high epitaxial quality. With the wide-bandgap material characteristic of the III-V drain structure, the insufficient power/range handling capability of silicon MOSFETs in high-frequency and high resolution applications will be effectively circumvented and the low breakdown voltage problem caused by the continuous shrinking of the component is substantially improved.

To achieve the aforementioned objectives, the present invention provides a silicon metal-oxide-semiconductor field effect transistor with a wide-bandgap III-V compound material drain. For instance, it can be fabricated but not limited by using a standard Semiconductor-on-Insulator (SOI) process. The fabrication starts with a silicon substrate, an insulation layer, and an active semiconductor layer. The silicon substrate has a (100) facet as a main surface, the insulation layer is formed on the main surface, and an active semiconductor layer is formed on the insulation layer. A dielectric layer is further formed on the active semiconductor layer. A metal gate, having a first side (or left-hand side) and a second side (or right-hand side) opposite to the first side, is formed on the dielectric layer. A source is formed in the semiconductor layer below the metal gate and formed at the first side (or left-hand side) of the metal gate. A hundred nanometer-scale hole, formed at the second side (or right-hand side) of the metal gate, penetrates through the semiconductor layer to extend to within the silicon substrate. The wall surface of the hundred nanometer-scale hole is formed of a sidewall and an inclined surface connected with the bottom of the sidewall, the inclined surface has a (111) facet of the silicon substrate, and a buffer layer is formed on the inclined surface. A III-V compound material drain is selectively formed in the hundred nanometer-scale hole.

The present invention also provides a method for fabricating a silicon metal-oxide-semiconductor field effect transistor with a wide-bandgap III-V compound semiconductor drain, which comprises providing a substrate comprising a silicon substrate, an insulation layer, and a semiconductor layer, the silicon substrate has a (100) facet as a main surface, the insulation layer is formed on the main surface, and the semiconductor layer is formed on the insulation layer. The fabrication process continues, for instance, by forming a dummy gate on the semiconductor layer; using the dummy gate as a hard mask and doping ions into the semiconductor layer to form a channel under the gate and two lightly-doped regions that are respectively formed at two sides of the channel, and the lightly-doped regions have a drain position and a source position; selectively etching the drain position to form a hundred nanometer-scale hole penetrating through the semiconductor layer to extend into the silicon substrate, the wall surface of the hundred nanometer-scale hole is formed of a sidewall and a V-grooved inclined surface toward the bottom of the sidewall, and the inclined surface is selectively etched to expose substrate's (111) facet; using metal organic chemical vapor phase deposition (MOCVD) to form a buffer layer on the inclined surface, forming a III-V epitaxy layer in the hundred nanometer-scale hole, and doping silicon atoms into the III-V epitaxy layer to form an N-type III-V compound semiconductor drain; heavily doping ions into the source position to form a source; removing the dummy gate to expose the semiconductor layer; forming a dielectric layer on the semiconductor layer exposed by removing the dummy gate; and forming a metal gate on the dielectric layer.

The present invention provides a silicon metal-oxide-semiconductor field effect transistor with a wide-bandgap III-V compound semiconductor drain and a method for fabricating the same, which first use selective etching to remove the original silicon drain and replacing it by growing III-V compound semiconductor epitaxial material (for instance GaN) in the etched drain region with (111) bottom facet to match the lattice constant of GaN. Compared with other advanced silicon transistors, the drain structure made of high quality with wide bandgap III-V compound semiconductor material (for instance GaN) can greatly increase the drain breakdown voltage and the dynamic operation range of the MOSFET for high power handling and high resolution data conversion applications.

Below, the embodiments are described in detail in cooperation with the drawings to make easily understood the technical contents, characteristics and accomplishments of the present invention.

DETAILED DESCRIPTION OF THE INVENTION

Figure 1A:
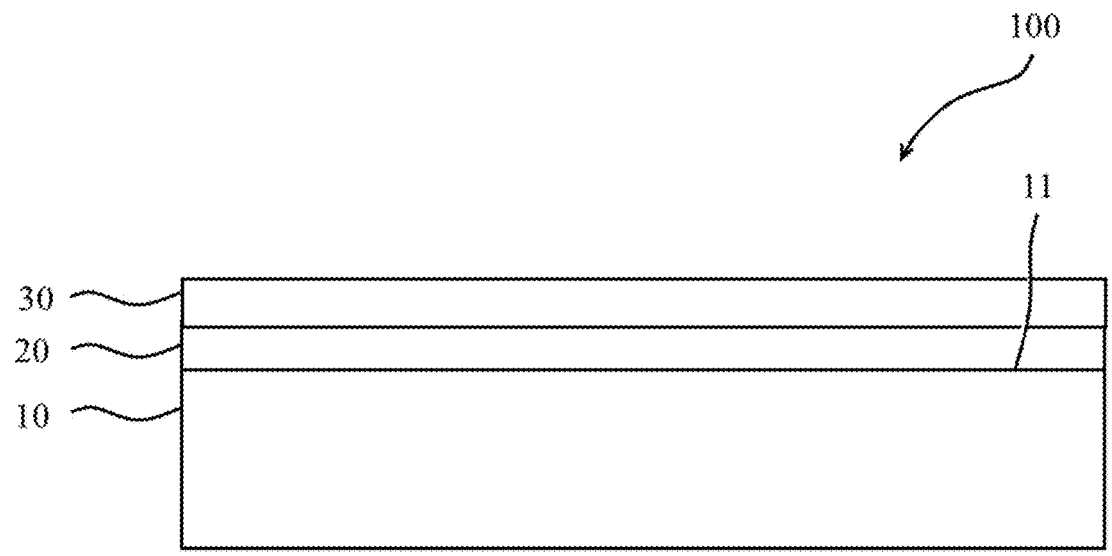
FIGS. 1A-1F are diagrams schematically illustrating the steps of fabricating a silicon metal-oxide-semiconductor field effect transistor (MOSFET) with a GaN drain according to an embodiment of the present invention.

The present invention provides a silicon metal-oxide-semiconductor field effect transistor with a wide-bandgap III-V compound material (for instance GaN) drain and a method for fabricating the same. The following embodiment is exemplified by a GaN drain fabricated on a silicon-on-insulator (SOI) substrate, but the present invention is not limited thereto. Refer to FIGS. 1A-1F, which are diagrams schematically illustrating the steps of fabricating a silicon metal-oxide-semiconductor field effect transistor (MOSFET) with a GaN drain according to an embodiment of the present invention. The method comprises the steps of:

As shown in FIG. 1A, a substrate 100 is firstly provided. In the embodiment, the substrate 100 is exemplified by a SOI substrate. The substrate 100 comprises a silicon substrate 10, an insulation layer 20, and a semiconductor layer 30. The silicon substrate 10 has a (100) facet as a main surface 11, the insulation layer 20 is formed on the main surface 11, and the semiconductor layer 30 is formed on the insulation layer 20. Specifically, the insulation layer 20 is a SiN layer, a $SiO_2$ layer, or a multi-layer structure formed of a SiN layer and a $SiO_2$ layer that are stacked together. The insulation layer 20 has a thickness of 100 nm.

Figure 1B:
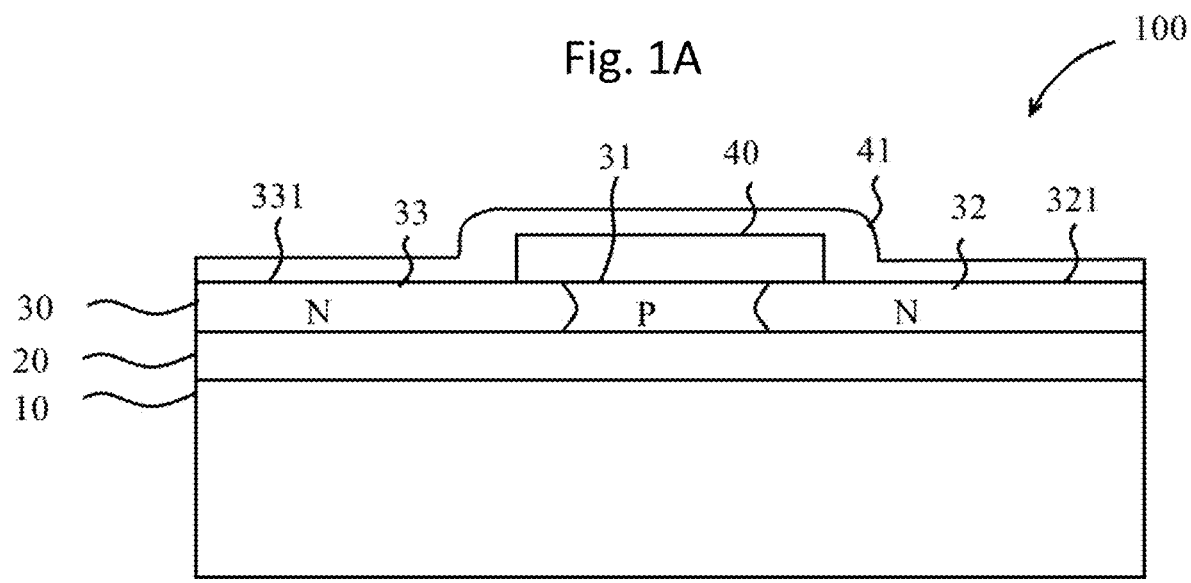

As shown in FIG. 1B, a dummy gate 40 is formed on the semiconductor layer 30. Preferably, the dummy gate 40 comprises polysilicon. Then, the dummy gate 40 is patterned. The dummy gate 40 is used as a hard mask and ions are doped into the semiconductor layer 30. In the embodiment, phosphor ions as N-type ions are doped into the semiconductor layer 30 to form a P-type channel 31 under the dummy gate 40 and two N-type lightly-doped regions 32 and 33 that are respectively formed at two sides of the channel 31. Then, a dielectric layer 41, formed on the semiconductor layer 30, covers the dummy gate 40.

The present invention simulates the length of a lightly doped drain, such that the N-type lightly-doped region 32 has a drain position 321 and the N-type lightly-doped region 33 has a source position 331.

Figure 1C:
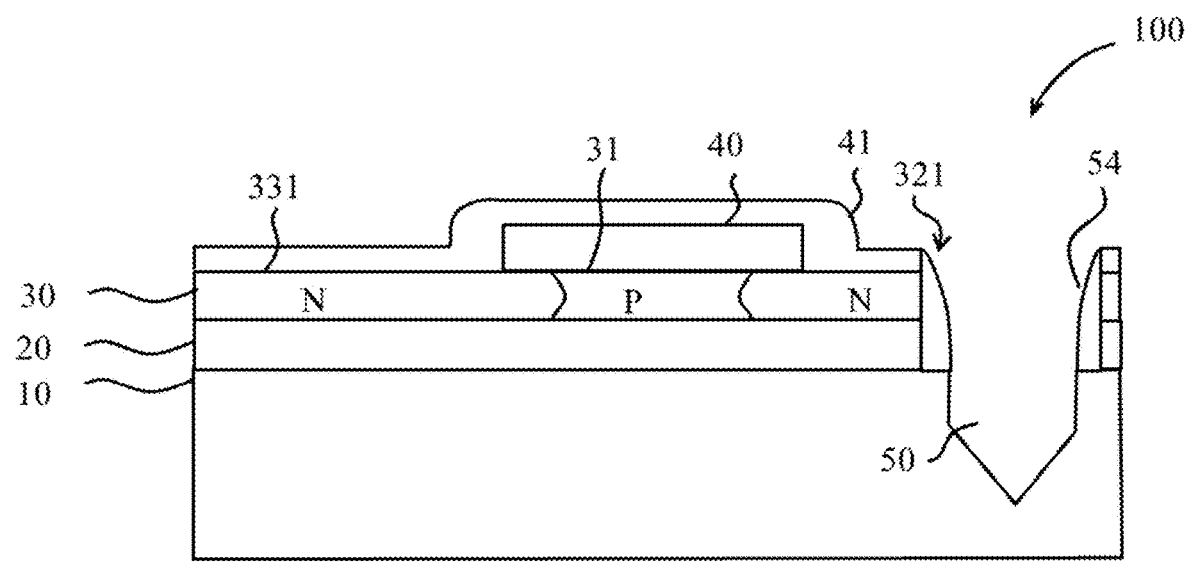

Then, as shown in FIG. 1C, the drain position 321 is selectively etched to form a hundred nanometer-scale hole 50.

Figure 2A:
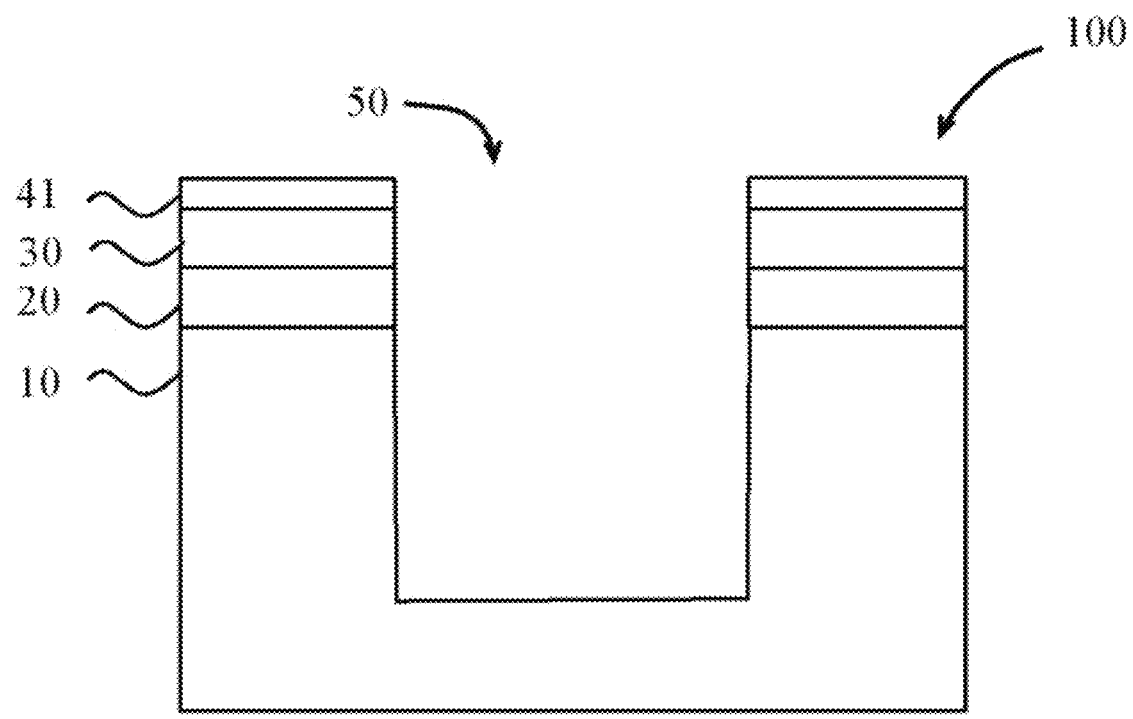
FIGS. 2A-2D are diagrams schematically illustrating the steps of fabricating a hundred nanometer-scale hole according to an embodiment of the present invention.

The steps of forming the hundred nanometer-scale hole 50 are described as follows. Refer to FIGS. 2A-2D. The pattern of the hundred nanometer-scale hole 50 is formed. Specifically, the dielectric layer 41 is patterned using electron beam lithography. Using reactive-ion etching (RIE), the patterned dielectric layer 41 is used as a hard mask to form the hundred nanometer-scale hole 50 in the substrate 100, as shown in FIG. 2A.

Figure 2B:
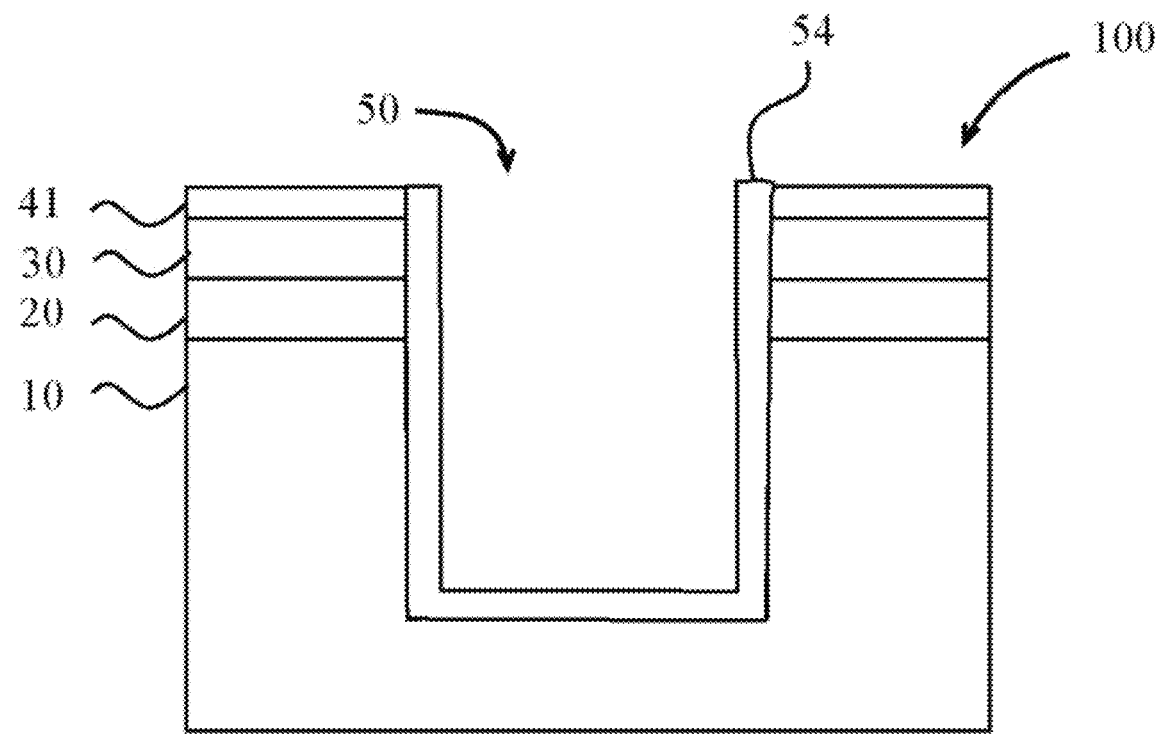

As shown in FIG. 2B, a nitride layer 60 having a given thickness is formed on the wall surface of the hundred nanometer-scale hole 50 using plasma enhanced chemical vapor deposition (PECVD). Specifically, the nitride layer 60 comprises SiNx and has a thickness of 200 nm. In this step, the hundred nanometer-scale hole 50 within the substrate 100 has a depth of 250 nm. In practice, the hundred nanometer-scale hole 50 within the substrate 100 has a depth of 100-500 nm.

Figure 2C:
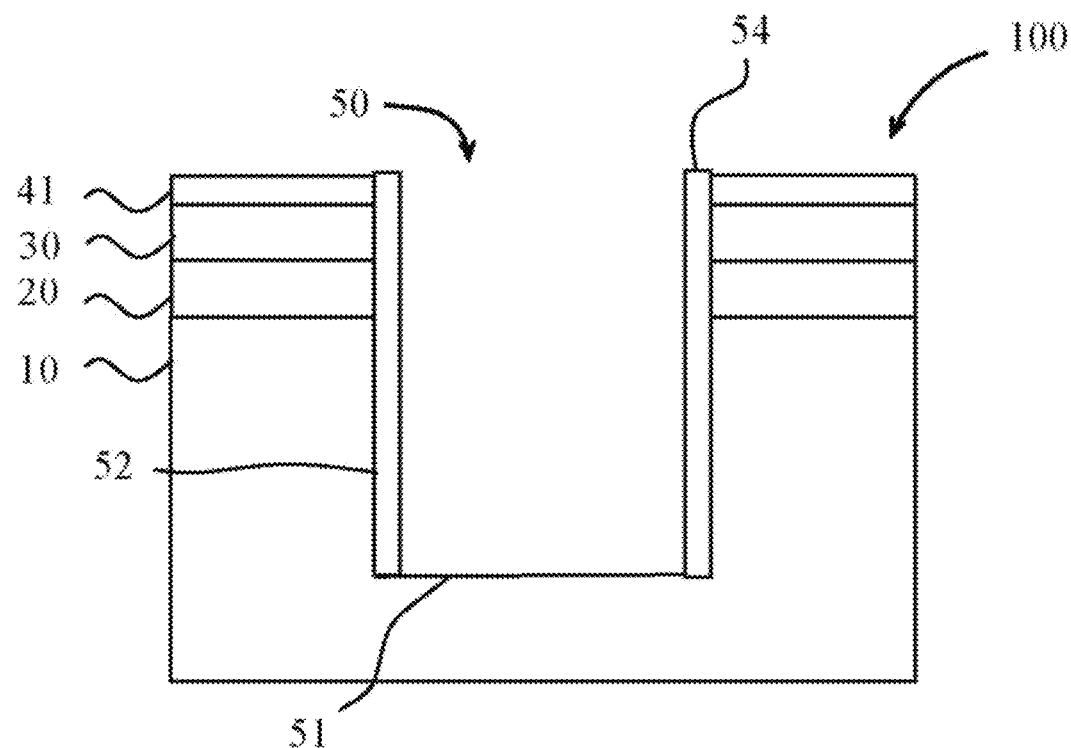

As shown in FIG. 2C, the nitride layer 54 on the bottom 51 of the hundred nanometer-scale hole 50 is removed using inductively coupled plasma (ICP) to expose the (100) facet of the silicon substrate 10, such that the nitride layer 54 on the sidewall 52 of the hundred nanometer-scale hole 50 remains.

Figure 2D:
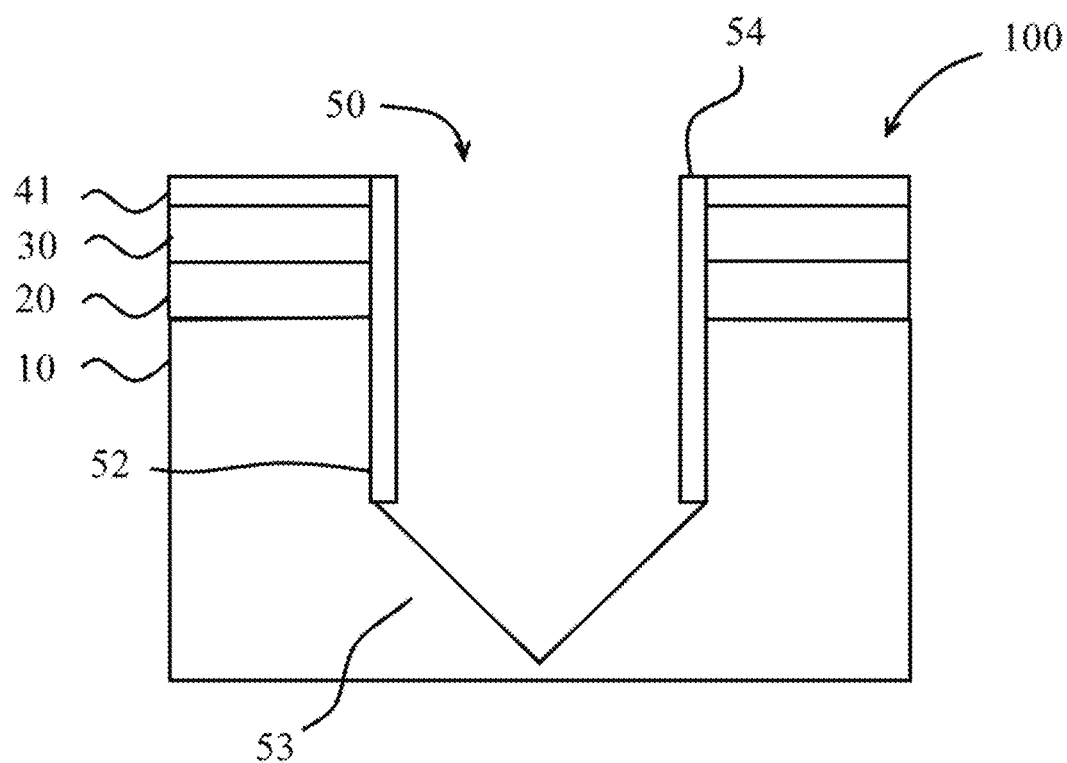

As shown in FIG. 2D, the nitride layer 54 on the sidewall 52 is used as a blocking layer and KOH is used as an etching solution. The (100) facet of the silicon substrate 10 exposed by the bottom of the hundred nanometer-scale hole 50 is etched for 110 seconds using the etching solution heated to 80 □, until the inclined surface 53 having a (111) facet of the silicon substrate 10 is exposed. In this step, the hundred nanometer-scale hole 50 shown in FIG. 2C is etched downward to form a V-shaped groove. The depth of the hundred nanometer-scale hole 50 within the substrate 100 is equal to the height of the sidewall 52 of the hundred nanometer-scale hole 50 within the substrate 100. The height of the sidewall 52 of the hundred nanometer-scale hole 50 within the substrate 100 has a range of 100-500 nm, wherein the range does not cover the V-shaped groove.

Figure 1D:
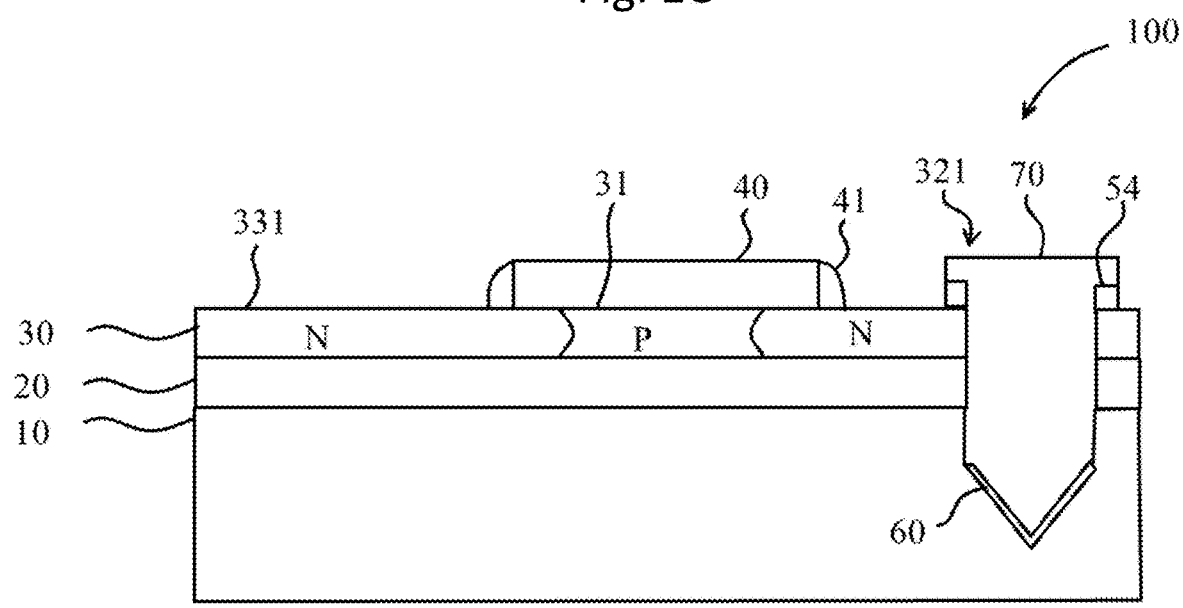

After fabricating the hundred nanometer-scale hole 50, an AlN buffer layer 60 is formed in the hundred nanometer-scale hole 50 using metal organic chemical vapor phase deposition (MOCVD), as shown in FIG. 1D. Then, a GaN epitaxial layer is formed in the hundred nanometer-scale hole 50 and silicon atoms are doped into the GaN epitaxial layer to form a GaN drain 70. Specifically, in the silicon doping method, a doping gas is formed by diluting silane (SiH4) in hydrogen to increase and control the concentration of doping silicon atoms in gallium nitride when the GaN epitaxial layer is grown, thereby forming an ideal GaN drain 70. Then, a part of the dielectric layer 41 is etched away such that the remains of the dielectric layer 41 surround the sidewall of the dummy gate 40.

Figure 1E:
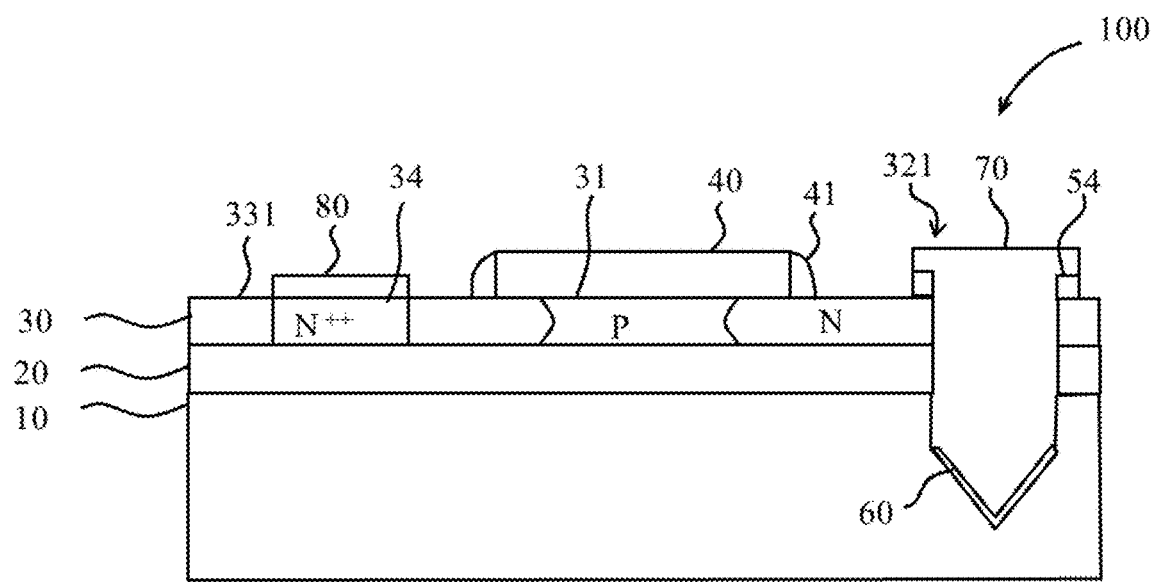

Then, as shown in FIG. 1E, ions are heavily doped into the source position 331 to form a heavily-doped region 34 as a source 80. In the embodiment, N-type ions with high concentration, such as phosphor ions, are doped to generate electrons flowing in the channel 31.

Figure 1F:
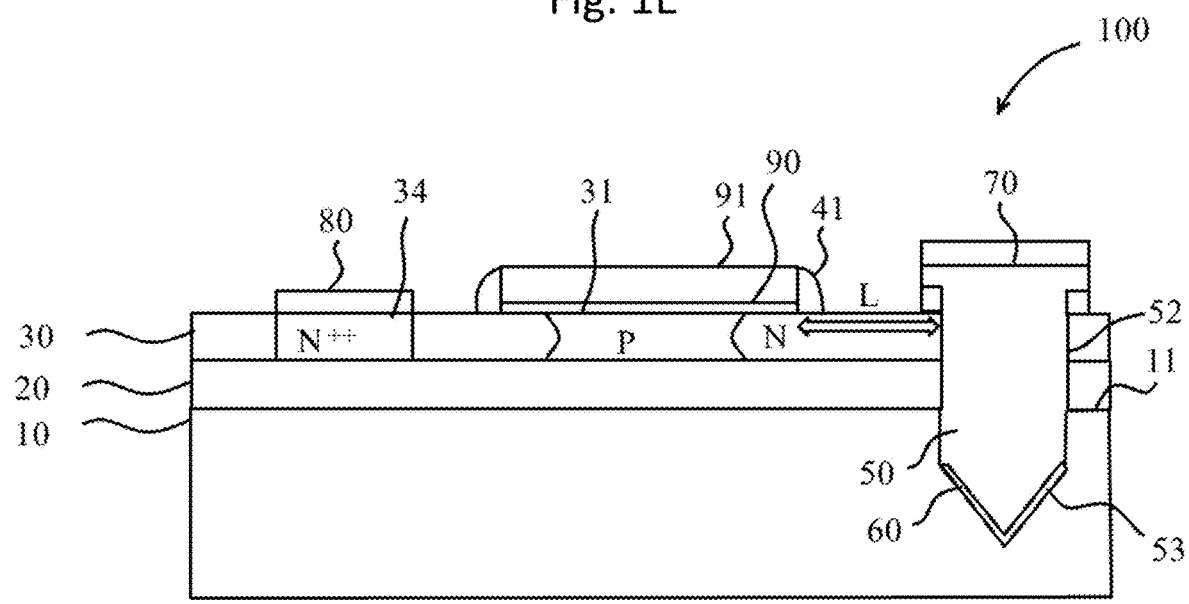

Then, as shown in FIG. 1F, the dummy gate 40 is etched and removed to expose the semiconductor layer 30. A dielectric layer 90 is formed on the semiconductor layer 30 exposed by removing the dummy gate 40. Finally, a metal gate 91 is formed on the dielectric layer 90, thereby forming a silicon metal-oxide-semiconductor field effect transistor with a GaN drain.

As shown in the figures, the silicon metal-oxide-semiconductor field effect transistor with a GaN drain of the present invention is composed of the substrate 100, the dielectric layer 90, the metal gate 91, the source 80, the hundred nanometer-scale hole 50, and the GaN drain 70. The substrate 100 includes the silicon substrate 10, the insulation layer 20, and the semiconductor layer 30 from bottom to top. The silicon substrate 10 has the (100) facet as the main surface 11. The dielectric layer 90 and the metal gate 91 are sequentially formed on the semiconductor layer 30. The source 80 is formed in the semiconductor layer 30 below the metal gate 91 and formed at one side of the metal gate 91, and the GaN drain 70 is formed in the hundred nanometer-scale hole 50 formed at another side of the metal gate 91. The hundred nanometer-scale hole 50 sequentially penetrates through the semiconductor layer 30 and the insulation layer 20 to extend to within the silicon substrate 10. The wall surface of the hundred nanometer-scale hole 50 is formed of the sidewall 52 and the inclined surface 53 connected with the bottom of the sidewall 52. The inclined surface 53 has the (111) facet of the silicon substrate 10. The AlN buffer layer 60 is formed on the inclined surface 53 of the hundred nanometer-scale hole 50. The GaN drain 70 is formed in the hundred nanometer-scale hole 50 and on the AlN buffer layer 60.

In an embodiment of the present invention, the sidewall 52 of the hundred nanometer-scale hole 50 is roughly vertical to the (100) facet as the main surface 11 of the silicon substrate 10, and the inclined surface 53 connected with the bottom of the sidewall 52 forms a V-shaped groove. The height of the sidewall 52 of the hundred nanometer-scale hole 50 within the substrate 100 has a range of 250-700 nm, wherein the range does not cover the V-shaped groove.

For the GaN epitaxial layer formed in the (100) silicon substrate 10, the angle between the inclined surface 53 of the (111) facet and the main surface 11 of the silicon substrate of the (100) facet is 54.74°. If use other III-V material, the V-shaped group may use other higher hexagonal angle to match the lattice.

Figure 5:
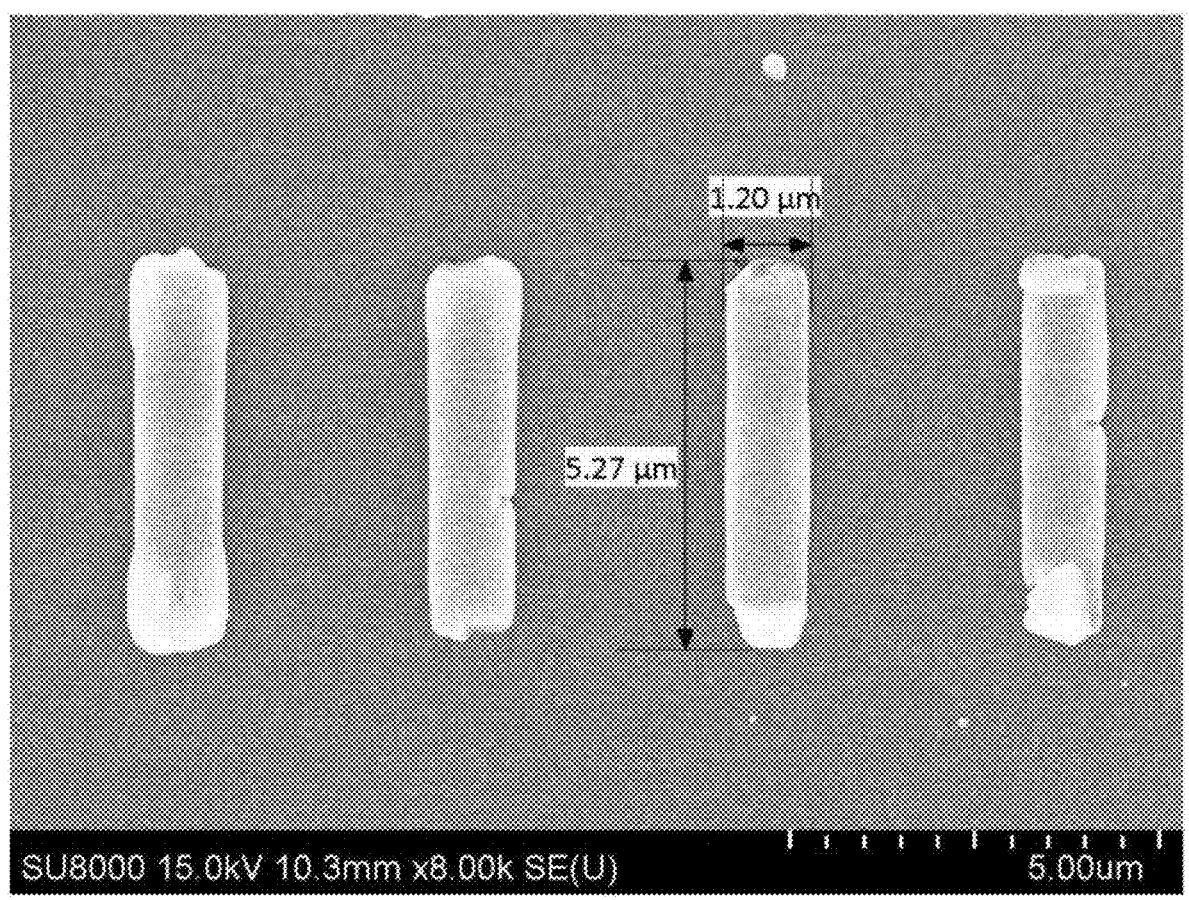
FIG. 5 is a diagram schematically illustrating a scanning electron microscope (SEM) image of a GaN drain according to an embodiment of the present invention.
Figure 6:
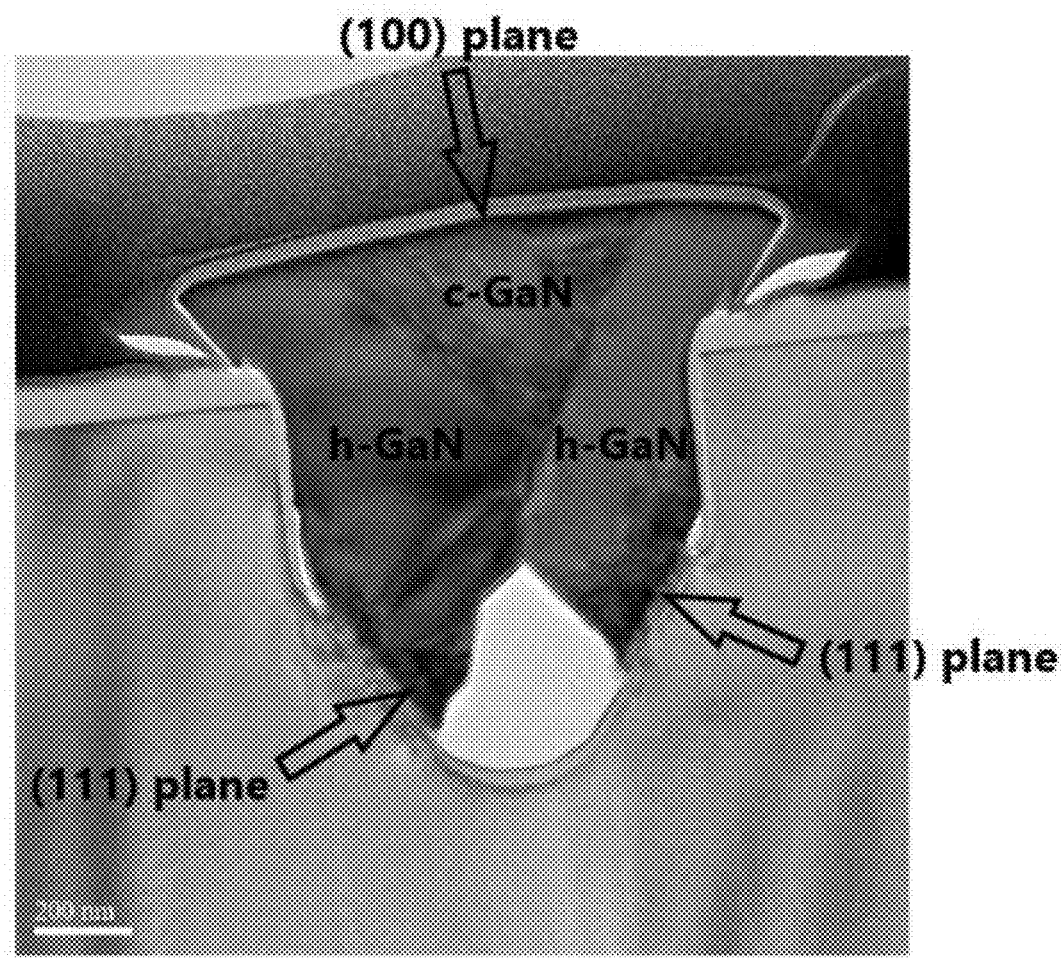
FIG. 6 is a diagram schematically illustrating a transmission electron microscopy (TEM) image of a GaN drain according to an embodiment of the present invention.

In the embodiment, the present invention uses selective area growth (SAG) to form GaN with high quality on the silicon substrate, thereby forming a drain and completing the Si-MOSFET. Owning to the material properties of GaN, the drain has a high breakdown voltage. As shown in FIG. 5, the GaN drain on the surface of the silicon substrate has a shape of a rectangular, wherein the rectangular has a length of 5.27 μm and a width of 1.20 μm. The GaN drain is shown in FIG. 6 in cross section. The central bottom of the GaN drain in the hundred nanometer-scale hole 50 has a serious lattice defect area and the surface and the two sidewalls of the GaN drain in the hundred nanometer-scale hole 50 has highly-crystallized areas. Besides, although the drain in the abovementioned embodiment is formed by cooperating with the dummy gate to dope N-type ions into the SOI substrate, the same drain is formed in a silicon substrate different from the SOI substrate.

Furthermore, using a wet etching method, the present invention forms the (111) facet of the (100) silicon substrate in a V-grooved process, wherein the (111) facet is used as a prefer nucleation surface of the AlN buffer layer and the GaN epitaxial layer. Hexagonal crystal gallium nitride (h-GaN) with single crystals is grown on the (111) facet. The lattice dislocation of the crystallization process will end on the sidewalls of the hundred nanometer-scale hole. The h-GaN grown on the two sidewalls of the hundred nanometer-scale hole is combined at the middle of the hundred nanometer-scale hole to form cubic crystal gallium nitride (c-GaN) with high crystallinity. The shape and the size of the GaN epitaxial layer are effectively controlled and designed using SAG When the GaN epitaxial layer is grown, silane is added to control the doping concentration of the GaN epitaxial layer, thereby controlling the vertical leakage and forming an ideal GaN drain with a wide bandgap. The GaN drain, successfully integrated with the Si-MOSFET, replaces the original drain. The detailed content of analyzing the lattice of the GaN epitaxial layer is based on the Taiwan Patent Application No. 108117447 titled "semiconductor structure with GaN heterogeneously integrated on silicon substrate and method for fabricating the same", the contents of which are hereby incorporated by reference in their entirety for all purposes.

In the embodiment, the present invention uses the drain made of heterogeneous GaN to replace the drain made of silicon of the conventional Si CMOS and overcome the problem with the low breakdown voltage of the drain of the MOSFET. Using the V-grooved preferential etching, the present invention removes the original Si drain to expose the sidewall being the (111) facet for growing the GaN epitaxial layer. Then, using selective lateral deposition, h-GaN is formed from the sidewall and combined to form c-GaN at the middle and the top thereof, thereby fabricating the drain. The heterogeneous material can successfully induce the channel that transmits carriers from the gate to the drain, thereby maintaining the high-speed properties of the component. Compared with silicon, GaN has a wider bandgap (e.g., the bandgaps of GaN and Si are 3.4 eV and 1.1 eV), thereby greatly reducing an ionization coefficient ($<1\times10^{-6}$) for electron collision and increasing the breakdown voltage.

Then, the present invention simulates and analyzes the voltage and current characteristics of the MOSFET with a GaN drain to demonstrate the performance of the component.

Figure 3:
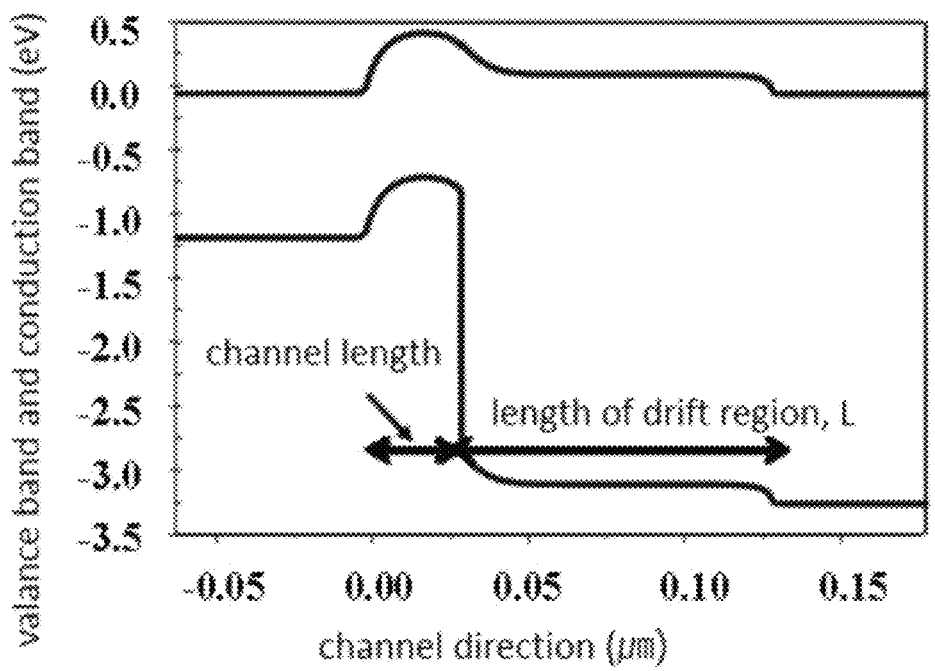
FIG. 3 is a diagram schematically illustrating an energy band of a MOSFET with a GaN drain according to an embodiment of the present invention.

Refer to FIG. 3. FIG. 3 is a diagram illustrating the energy band of the MOSFET with a lateral diffusion (LD)-GaN drain. Compared with the energy band of a drain made of Si or SiGe, GaN has a higher bandgap. Thus, it can be predicted that the performance of GaN drain in withstanding breakdown voltage should be overwhelm superior than that of Si or SiGe drains (bandgap of Ge: 0.67 eV).

Figure 4:
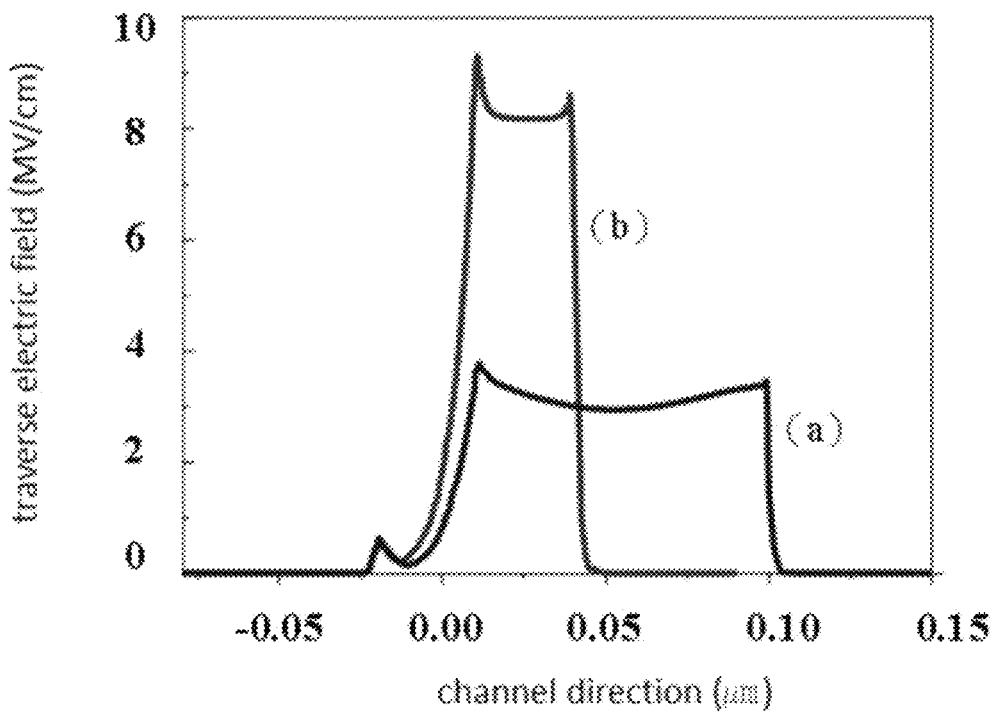
FIG. 4 is a diagram schematically illustrating transverse electric fields for different lengths of the drift region of a MOSFET with a GaN drain according to an embodiment of the present invention.

Refer to FIG. 4. FIG. 4 is a diagram illustrating the traverse electric field of the MOSFET with a LD-GaN drain having different lengths L of a drift region simulated by technology computer aided design (TCAD). Curves (a) and (b) show the traverse fields applied across a PN junction formed of a channel and a lightly-doped drain (LDD) for different lengths of the LDD. Curves (a) and (b) show that the length L of the drift region is stretched to 100 nm and 40 nm, respectively. Wherein the x-axis represents a channel direction. The length L of the drift region represents the distance between the gate and the drain with the edge of the gate being a reference position of 0.00 (as shown in FIG. 1F). As shown in FIG. 4, the peak (highest) value of the traverse electric field, which occurs at the edge of the gate closer to the drain, is 3.6 MV/cm. However, when the length of the LDD increases from 0 nm to 10 nm, the highest traverse electric field maintains constant and moves to a position where the gate overlaps the drain but the electric field decreases significantly.

Compared with the other advanced silicon transistors, the GaN drain overcomes the problem with the breakdown event caused by scaling down the component. Many applications that were previously only in the III-V group field can now be implemented on Si CMOS devices. However, it is difficult to grow compound materials with high quality on a silicon substrate, such as bonding or epitaxial growing. Dealing with CMOS devices and other III-V group devices can also be problematic for cross-contamination and different thermal cycling requirements. In order to avoid the abovementioned problem and have advantages of compound semiconductor, the embedded III-V drain in highly integrated silicon integrated circuit are required. The present invention uses the GaN drain to form a radio frequency (RF) MOSFET with high breakdown and high dynamic range capabilities. The present invention mainly uses GaN as a wide-bandgap semiconductor to replace the silicon in MOSFET drain.

The synthesis of small-area Nano Heteroepitaxial (NHE) materials and the aspect ratio trapping (ART) principle have been proven feasible for growing high-electronic-quality and low-defect-density c-GaN in MOSFET drain with bottom exposed (111) facet, which is initially lattice matched to h-GaN. This is critical to the power and resolution performance of devices/circuits. The device of the present invention can be the main competitor for the next-generation high voltage/power RF transistors in 5G/6G millimeter-wave applications.

In addition to the wide-bandgap characteristic, GaN has high electron mobility. There have been considerable researches on the development of high-frequency components and thin-film epitaxy. Distinct from the conventional thin-film epitaxy, the present invention uses selective epitaxy to deposit and form a GaN drain. In our laboratory, GaN has now been successfully heteroepitaxially grown in the hundred nanometer-scale hole of a $SiO_2$/Si substrate. From transmission electron microscope (TEM) images, the epitaxial GaN has high quality and low defect. Using the technology, the insufficient power handling and data resolution capability of silicon metal-oxide-semiconductor field effect transistors in high-frequency (or high speed) applications is effectively circumvented and the drawback of low breakdown voltage of the MOSFET is substantially boosted.

Except for GaN, the present invention does not exclude us from growing other wide-bandgap III-V compound materials on a (100) Si substrate and using a selective etching method to form a preselected silicon facet for lattice mismatch, thereby growing any III-V compound semiconductor drain with high quality and integrating the III-V group drain with the Si MOSFET.

In conclusion, the silicon metal-oxide-semiconductor field effect transistor with a wide-bandgap III-V group drain and the method for fabricating the same of the present invention use the wide-bandgap characteristic and selective epitaxy to form a III-V group drain with high quality and low defect, thereby overcoming the problems with device breakdown voltage and circuit operation range. After the III-V group drain is integrated with a Si MOSFET, the problem with low breakdown voltage caused by scaling down the component is overcome. The present invention is applicable to Si very-large-scale integration (VLSI) for implementing Systems-on-a-Chip (SoC) having an extremely wide dynamic range, especially high-linearity, high-efficiency for high frequency power amplifier and high-precision data converter circuits, such as 5G/6G and RF/microwave/millimeter-wave radar and radio's high-linearity/efficiency back-end transmitters, and high-resolution baseband analog-to-digital & digital-to-analog converters.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A silicon metal-oxide-semiconductor field effect transistor (MOSFET) with a wide-bandgap III-V compound semiconductor drain comprising:
    a substrate comprising a silicon substrate, and a semiconductor layer, the silicon substrate has a (100) facet as a main surface, the semiconductor layer is formed on the main surface;
    a dielectric layer formed on the semiconductor layer;
    a metal gate, having a first side and a second side opposite to the first side, formed on the dielectric layer;
    a source formed in the semiconductor layer below the metal gate and formed at the first side of the metal gate;
    a hundred nanometer-scale hole, formed at the second side of the metal gate, penetrating through the semiconductor layer to extend to within the silicon substrate, a wall surface of the hundred nanometer-scale hole is formed of a sidewall and an inclined surface connected with a bottom of the sidewall, the inclined surface has a (111) facet of the silicon substrate, and a buffer layer is formed on the inclined surface; and
    a III-V group drain formed in the hundred nanometer-scale hole;
    wherein a horizontal distance between the drain and the gate ranges 40-100 nm.

2. The silicon metal-oxide-semiconductor field effect transistor with a wide-bandgap III-V group drain according to claim 1, wherein the substrate further comprising an insulation layer, the insulation layer is formed between the silicon substrate and the semiconductor.

3. The silicon metal-oxide-semiconductor field effect transistor with a wide-bandgap III-V group drain according to claim 2, wherein the insulation layer is a SiN layer, a $SiO_2$ layer, or a multi-layer structure formed of a SiN layer and a SiO$_2$ layer that are stacked together.

4. The silicon metal-oxide-semiconductor field effect transistor with a wide- bandgap III-V group drain according to claim 3, wherein the insulation layer has a thickness of 100 nm.

5. The silicon metal-oxide-semiconductor field effect transistor with a wide-bandgap III-V compound semiconductor drain according to claim 1, wherein the sidewall of the hundred nanometer-scale hole within the substrate has a height of 100-500 nm.

6. The silicon metal-oxide-semiconductor field effect transistor with a wide-bandgap III-V compound semiconductor drain according to claim 1, wherein the sidewall is perpendicular to the (100) facet as the main surface.

7. The silicon metal-oxide-semiconductor field effect transistor with a wide-bandgap III-V compound semiconductor drain according to claim 1, wherein the angle between the inclined surface and the main surface of the silicon substrate is 54.74°.

8. The silicon metal-oxide-semiconductor field effect transistor with a wide-bandgap III-V compound semiconductor drain according to claim 1, wherein the III-V compound semiconductor is a GaN drain including cubic crystal gallium nitride.

9. A method for fabricating a silicon metal-oxide-semiconductor field effect transistor (MOSFET) with a wide-bandgap III-V compound semiconductor drain comprising:

providing a substrate comprising a silicon substrate, and a semiconductor layer, the silicon substrate has a (100) facet as a main surface, the semiconductor layer is formed on the main surface;

forming a dummy gate on the semiconductor layer;

using the dummy gate as a hard mask and doping ions into the semiconductor layer to form a channel under the dummy gate and two lightly-doped regions that are respectively formed at two sides of the channel, and the lightly-doped regions have a drain position and a source position;

selectively etching the drain position to form a hundred nanometer-scale hole penetrating through the semiconductor layer to extend to within the silicon substrate, a wall surface of the hundred nanometer-scale hole is formed of a sidewall and an inclined surface connected with a bottom of the sidewall, and the inclined surface has a (111) facet of the silicon substrate;

using metal organic chemical vapor phase deposition (MOCVD) to form a III-V epitaxy layer in the hundred nanometer-scale hole, and doping silicon atoms into the III-V epitaxy layer to form a III-V group drain;

heavily doping ions into the source position to form a source;

removing the dummy gate to expose the semiconductor layer;

forming a dielectric layer on the semiconductor layer exposed by removing the dummy gate; and forming a metal gate on the dielectric layer.

10. The method for fabricating a silicon metal-oxide-semiconductor field effect transistor with a wide-bandgap III-V compound semiconductor drain according to claim 9, wherein the substrate further comprising an insulation layer, the insulation layer is formed between the silicon substrate and the semiconductor.

11. The method for fabricating a silicon metal-oxide-semiconductor field effect transistor with a wide-bandgap III-V compound semiconductor drain according to claim 10, wherein the insulation layer is a SiN layer, a SiO$_2$ layer, or a multi-layer structure formed of a SiN layer and a SiO$_2$ layer that are stacked together.

12. The method for fabricating a silicon metal-oxide-semiconductor field effect transistor with a wide-bandgap III-V compound semiconductor drain according to claim 10, wherein the insulation layer has a thickness of 100 nm.

13. The method for fabricating a silicon metal-oxide-semiconductor field effect transistor with a wide-bandgap III-V compound semiconductor drain according to claim 9, wherein the sidewall of the hundred nanometer-scale hole within the substrate has a height of 100-500 nm.

14. The method for fabricating a silicon metal-oxide-semiconductor field effect transistor with a wide-bandgap III-V compound semiconductor drain according to claim 9, wherein the sidewall is perpendicular to the (100) facet as the main surface and the inclined surface connected with a bottom of the sidewall.

15. The method for fabricating a silicon metal-oxide-semiconductor field effect transistor with a wide-bandgap III-V compound semiconductor drain according to claim 9, wherein the angle between the inclined surface and the main surface of the silicon substrate is 54.74°.

16. The method for fabricating a silicon metal-oxide-semiconductor field effect transistor with a wide-bandgap III-V compound semiconductor drain according to claim 9, wherein the inclined surface connected with a bottom of the III-V group drain, and the inclined surface has the (111) facet of the silicon substrate to form a nucleation layer of h-GaN on the inclined surface, which is more lattice matched to the (111) facet.

17. The method for fabricating a silicon metal-oxide-semiconductor field effect transistor with a wide-bandgap III-V compound semiconductor drain according to claim 16, wherein the initial growth of h-GaN layer on the inclined surface eventually combine from both sides to form a high quality c-GaN drain on a top surface to be heavily doped with Si ions to from the III-V group drain of the MOSFET.

18. The method for fabricating a silicon metal-oxide-semiconductor field effect transistor with a wide-bandgap III-V group drain according to claim 9, wherein the III-V group drain is a c-GaN topped drain including cubic crystal gallium nitride with high electron mobility.

* * * * *